(12) United States Patent
Wang et al.

(10) Patent No.: US 6,730,196 B2
(45) Date of Patent: May 4, 2004

(54) AUXILIARY ELECTROMAGNETS IN A MAGNETRON SPUTTER REACTOR

(75) Inventors: Wei D. Wang, San Jose, CA (US); Praburam Gopalraja, San Jose, CA (US); Jianming Fu, Palo Alto, CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 10/210,953

(22) Filed: Aug. 1, 2002

(65) Prior Publication Data

US 2004/0020770 A1 Feb. 5, 2004

(51) Int. Cl.[7] .................................................. C23C 14/35
(52) U.S. Cl. .......................... 204/298.06; 204/298.18; 204/298.22
(58) Field of Search ................ 204/298.06, 298.12, 204/298.17, 298.18, 298.22

(56) References Cited

U.S. PATENT DOCUMENTS

| 6,179,973 | B1 |   | 1/2001 | Lai et al. ................ 204/192.12 |
| 6,251,242 | B1 | * | 6/2001 | Fu et al. ................. 204/298.19 |
| 6,277,249 | B1 |   | 8/2001 | Gopalraja et al. ..... 204/192.12 |
| 6,352,629 | B1 |   | 3/2002 | Wang ....................... 204/298.2 |
| 6,406,599 | B1 |   | 6/2002 | Subramani et al. .... 204/298.09 |

* cited by examiner

*Primary Examiner*—Steven VerSteeg
(74) *Attorney, Agent, or Firm*—Charles S. Guenzer

(57) ABSTRACT

A magnetron sputter reactor having a complexly shaped target with a vault arranged about a central axis facing the wafer. The vault may be right cylindrical with axially magnetized magnets disposed in back of its sidewall or be annular with preferably opposed magnets disposed in back of its two sidewalls. One or two electromagnetic coils are disposed about the processing space between the target and the wafer to either promote extraction of metal ions from the vault, to defocus the ion beam extracted from the vault and focused towards the central axis, or to compensate for a magnetic shield surrounding the reactor.

20 Claims, 6 Drawing Sheets

AUXILIARY ELECTROMAGNETS IN A MAGNETRON SPUTTER REACTOR

BACKGROUND OF THE INVENTION

1. Field of the Invention

The invention relates generally to sputtering of materials. In particular, the invention relates to the magnets enhancing plasma sputtering.

2. Background Art

Sputtering, alternatively called physical vapor deposition (PVD), is widely used to deposit layers of metals and related materials in the fabrication of semiconductor integrated circuits. Conventional sputter reactors include a planar target of the metal to be sputtered in opposition to the wafer being coated. A working gas, typically argon, fills the chamber at low pressure. In DC sputtering, a negative voltage is applied to the target sufficient to discharge the argon into a plasma. The positive argon ions are attracted to the negatively biased target with sufficient energy that they sputter metal atoms from the target. Some of the sputtered metal atoms strike the wafer and coat it with a layer of the metal. In reactive sputtering, most often of metal nitrides, nitrogen, oxygen, or other reactive gas is additionally filled into the chamber. The reactive gas reacts with the sputtered metal atoms at the surface of the wafer forming a metal nitride or other compound layer on the wafer surface.

The multiple wiring levels representative of advanced integrated circuits include inter-level dielectric layers, typically of silicon dioxide or related silicate glass, separating neighboring pairs of generally horizontally extending electrical interconnects. Vias are electrical plugs extending vertically through the inter-level dielectric layers to interconnect the different wiring levels. A via is formed by etching a narrow hole through the exposed dielectric layer and then filling the holes with the metallization after a proper barrier or seed layer has been coated onto the sidewalls and bottom of the via hole. The increased capacity of advanced integrated circuits is achieved in large part by shrinking the horizontal dimensions of its elements. The minimum width of vias is being pushed to 0.18 $\mu$m and below. A minimum width of 0.07 $\mu$m is being planned for the not too distant future. However, for a number of reasons, the thickness of the inter-level dielectric layers needs to be at least about 0.7 $\mu$m thick and may be even more for some complex structures. The result is that the aspect ratio of via holes is being pushed to above 5 for current products, and an aspect ratio of 10 or even higher is contemplated.

Sputtering has long been used to sputter aluminum for horizontal interconnections and to simultaneously fill via holes extending between metallization levels. Special sputtering techniques have been developed to deposit thin layers into narrow and deep vias to act as barrier and seed layers. Typical barrier materials include titanium, tantalum, tungsten, and their nitrides, all of which can be sputtered. Silicidation metals can also be sputtered. These layers need be only a few nanometers thick, but they must coat the sides of the via holes, a difficult but achievable process in sputtering. Copper is replacing aluminum in advanced integrated circuits for the metallization materials. Although most of the copper is deposited by electrochemical plating (ECP), a thin copper seed layer is required to initiate the ECP growth and to provide a plating electrode. Again, the copper seed layer must coat the side of the via holes.

Sputtering into high aspect-ratio holes is a difficult task since the sputtering process itself produces an approximately isotropic sputtering pattern. One general technique causes a large fraction of the sputtered metal atoms to be ionized. A negative electrical bias is applied to the pedestal electrode supporting the wafer being sputter coated to accelerate the metal ions to a high velocity perpendicular to the wafer so that they penetrate deeply within high aspect-ratio holes.

Several types of plasma sputter reactors have been developed which enable a high metal ionization fraction. One such reactor is the SIP$^{+\text{TM}}$ PVD reactor available from Applied Materials, Inc. of Santa Clara, Calif. Gopalraja et al. describes an initial design in U.S. Pat. No. 6,277,249. A more complete design is described by Gopalraja et al. in U.S. patent application Ser. No. 09/703,601, filed Nov. 1, 2000 and now issued as U.S. Pat. No. 6,451,177, and by Subramani et al. in U.S. Pat. No. 6,406,599. The latter two references are incorporated here by reference in their entireties. The SIP$^+$ reactor, which will be described in detail later, includes a complexly shaped target having an annular vault facing the wafer. The vault includes inner and outer sidewalls and a roof bridging the sidewalls.

The technology of the SIP$^+$ reactor derives many of its advantages from the strength and shape of magnets placed behind the vault sidewalls and roof. However, the high magnetic intensities introduce their own complexities and artifacts, which need to be controlled and in some cases compensated. Producing uniform sputter deposition is a challenge when the annular vaulted target and its magnetrons are distinctly non-uniform in the radial direction. Although remarkable process results have been achieved, further improvements are desired.

SUMMARY OF THE INVENTION

A magnetron sputter reactor includes a complexly shaped target having a vault arranged about a central axis and facing across a processing space the substrate being sputter deposited. The vault may be a right cylindrical vault having a single cylindrical sidewall or an annular vault having inner and outer cylindrical sidewalls. Magnets polarized along the central axis are arranged in back of the sidewalls. In the case of an annular vault, the magnets of the two sidewalls preferably have anti-parallel magnetic polarities and are unbalanced with the outer sidewall magnets having a substantially greater total magnetic intensity than do the inner sidewall magnets. For either the cylindrical vault or for the unbalanced magnets of the annularly vaulted target, the outer sidewall magnets produce a magnetic field component which projects from the bottom of the outer sidewall magnets towards the substrate while trending towards the central axis before looping back outside the outer sidewall to the back of the outer sidewall magnets. Optionally, a closed magnetic assembly is positioned over the roof bridging the one or more sidewalls and may advantageously be scanned about the central axis.

One or two electromagnetic coils are wrapped around the processing space. For the annular vault, a single coil is energized to produce a magnetic field in its throat that is parallel along the central axis with the magnetic field produced by the outer sidewall magnets within their throat. If the sputter reactor is surrounded by a magnetic shield or shroud, which tends to shunt the projecting portions of the magnetic field, a single coil is energized to produce a magnetic field in its throat that is anti-parallel along the central axis with the magnetic field produced by the single sidewall magnets of the cylindrical vault or the outer sidewall magnets of the annular vault within their respective throats.

In another aspect of the invention, two electromagnetic coils are positioned to be coaxial and spaced apart along the central axis. The coil nearer the target is energized to produce a magnetic field within its throat that is anti-parallel to that produced by the (outer) sidewall magnets within their throat, and the coil near the substrate is energized to produce the opposite magnetic field.

DETAILED DESCRIPTION OF THE PREFERRED EMBODIMENTS

Figure 1:
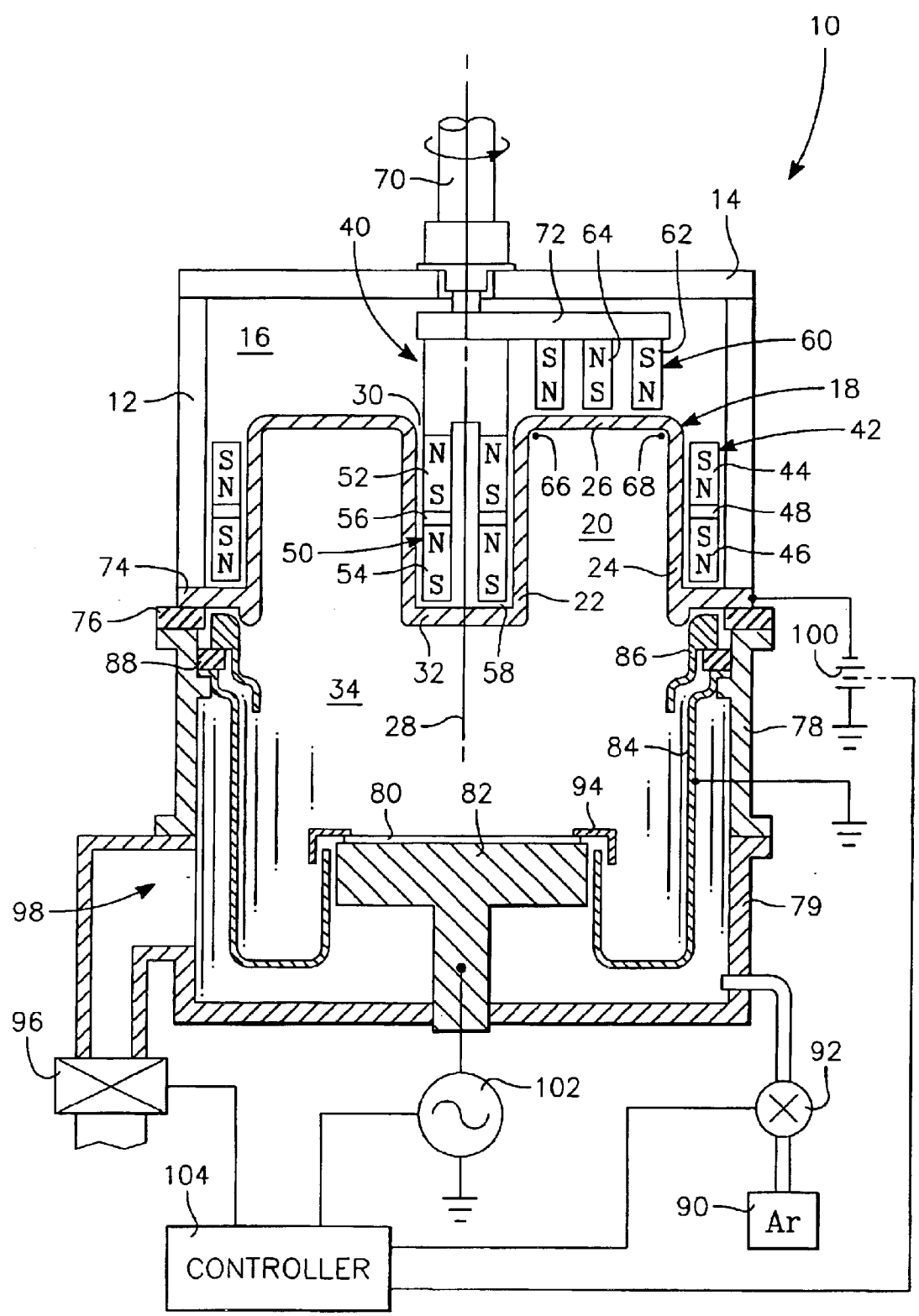
FIG. 1 is a cross-sectional view of a magnetron sputter reactor having a target shaped with an annular vault, unbalanced sidewall magnetrons, and a rotating roof magnetron.

An SIP+ magnetron sputter reactor 10 is illustrated in the schematic cross-sectional view of FIG. 1. The upper chamber above the main processing volume includes a cylindrical upper wall 12, which supports a chamber roof 16. A vault-shaped target 18 is fixed and sealed to the upper wall 12, which is sealed to the chamber roof 16, to allow cooling water to form a bath that circulates in a space 16 in back of the target 18. The vault-shaped target 18 includes an annular vault 20 having an inner sidewall 22, an outer sidewall 24, and a vault roof 26, all generally circularly symmetric with respect to a vertical chamber axis 28. The inner and outer vault sidewalls 24 extend generally parallel to the chamber axis 28 while the vault roof 26 extends generally perpendicularly thereto. That is, the vault 20 is annularly shaped with a generally rectangular cross section. The vault 20 has an aspect ratio of axial depth to radial width typically of at least 1:2 and preferably at least 1:1. A generally cylindrical well 30 is formed within the cylindrical inner sidewall 24 and is defined at its bottom by a flattened target portion 32 facing a processing space 34 of the reactor.

A magnetron 40 is placed in back of the vaulted target 18 in close association with the vault 20. The magnetron 40 includes a stationary ring-shaped outer sidewall magnet assembly 42 including two sets of cylindrical magnets 44, 46 placed outside the outer vault sidewall 24 in two vertically displaced circles, having a first vertical magnetic polarity along the central axis 28, and separated by a non-magnetic spacer 48. A rotatable inner sidewall magnet assembly 50 includes two sets of cylindrical magnets 52, 54 placed inside the inner vault sidewall 22 in two vertically displaced circles, having a second vertical magnetic polarity opposite the first magnetic polarity, and separated by a non-magnetic tubular spacer 56. The outer and inner sidewall magnet assemblies 42, 50 may be referred to as respective sidewall magnetrons. The bottom of the inner magnet assembly 50 is separated from the back of the planar portion 32 of the vaulted target 18 by a small gap 58 having an axial extent of between 0.5 to 1.5 mm.

The outer sidewall magnet assembly 42 has a magnetic strength that is substantially stronger than that of the inner sidewall magnet assembly 50, which is easily accomplished because of the geometry. Assuming the inner and outer magnets 44, 46, 52, 54 have the same diameter and are composed of the same magnetic material that is equally magnetized, there may be ten inner magnet pairs 52, 54 and sixty magnet pairs 44, 46. As a result, the total magnetic intensity of the outer sidewall magnet assembly 42 is about six times the total magnetic intensity of the inner sidewall magnet assembly 50. The total magnetic intensity is the integral of the magnetic flux density over the surface of the top or bottom face of the respective magnet assembly 42, 50. That is, the combined sidewall magnet assemblies constitute a strongly unbalanced magnetron part. For replicated cylindrical magnets, the ratio of the total magnetic intensities is simply the ratio of the number of magnets in a corresponding plane.

The magnetron 40 also includes a rotatable roof magnet assembly 60 in a nested arrangement of an outer ring magnet 62, generally circularly shaped, having a first vertical magnetic polarity surrounding an inner rod magnet 64 having a second vertical magnetic polarity. It is preferred, although not required, that the magnetic polarity of the outer ring magnet 62 be anti-parallel to that of the inner sidewall magnet assembly 50 so as to avoid strong magnetic fields adjacent to the upper inner corner 66 of the target vault 20 and to instead intensify the magnetic field at the outer upper corner 68, which is being more quickly scanned. The total magnetic intensity of the outer ring magnet 62 is advantageously greater than that of the inner ring rod magnet 64, preferably being greater by a factor of at least 150%, thereby producing a second unbalanced magnetron part.

The sidewall magnet assemblies 42, 50 and roof magnet assembly 60 may be referred to in the alternative as respective magnetrons.

Both the inner sidewall magnet assembly 50 and the roof magnet assembly 60 are rotatable about the chamber axis 28. The inner sidewall magnet assembly 50 is connected to and supported by a shaft 70 rotated about the chamber axis 28 by an unillustrated motor. The roof magnet assembly 60 includes a magnetic yoke 72, which is fixed to the rotating shaft 70. The inner sidewall magnet assembly 50 is essentially circularly symmetric but is rotated for reasons connected with the cooling system, as is described by Subramani et al. in the above cited patent. In this embodiment, the outer sidewall magnet assembly 42 is stationary and supported by the upper wall 12.

A rim 74 of the target 18 is supported through a dielectric isolator 76 on a metallic adapter 78, which in turn is supported on a lower chamber 79. The separate adapter 78 simplifies changes in the overall height of the chamber, in particular, the target-to-wafer spacing since only the simple adapter 78 needs to be reengineered rather than the more complicated lower chamber 79 including its pumping port and wafer loadlock. A wafer 80 to be sputter coated is supported on a pedestal electrode 82 in opposition to the target 18. A grounded shield 84 is supported on and grounded to the adapter 78. It acts both to protect the adapter 78 and lower chamber 79 from sputter deposition and to provide a grounded anode for the sputtering plasma An electrically floating shield 86 is supported through a second dielectric isolator 88 on the adapter 78 above the grounded shield 84 and close to the target 18. Negative electrical charge built up on the floating shield 86 repels the plasma electrons and thus reduces electron loss from the plasma near the target 18.

A sputter working gas such as argon is supplied from a gas source 90 through a mass flow controller 92 to the area in back of the grounded shield 84. It flows through a gap formed between the pedestal 82, the grounded shield 84, and a plasma ring 94 to the processing space 34 between the pedestal 82 and the target 18. The pressure in the vacuum chamber is maintained by a vacuum pump system 96 connected to the chamber in back of the grounded shield 84 through a pumping port 98 formed in the lower chamber 76. Although the chamber has a base pressure in the neighborhood of $10^{-8}$ Torr, in typical sputtering operations not involving complete sustained self-sputtering the chamber pressure is typically held between 0.1 and 5 milliTorr.

The plasma is initiated by flowing argon into the chamber and igniting it into a plasma by supplying DC voltage from a DC power supply 100 connected to the target 18. Although a higher voltage is needed for ignition, a target voltage of about −400 to −700 VDC maintains a plasma within the chamber. Especially in the case of sputtering copper, once the plasma has been ignited, the supply of argon may be reduced or even eliminated. The pedestal electrode 82 may be left electrically floating, in which case it nonetheless builds up a negative DC bias. On the other hand, the DC self-bias can be increased and controlled by applying RF power from an RF bias supply 102 to the pedestal electrode 82. The DC self-bias is effective at accelerating metal ions in the direction perpendicular to the wafer 24. An electronic controller 104 controls the two power supplies 100, 102, the argon mass flow controller 92, and the vacuum system 96 according to the recipe developed for the desired sputtering process.

Figure 2:
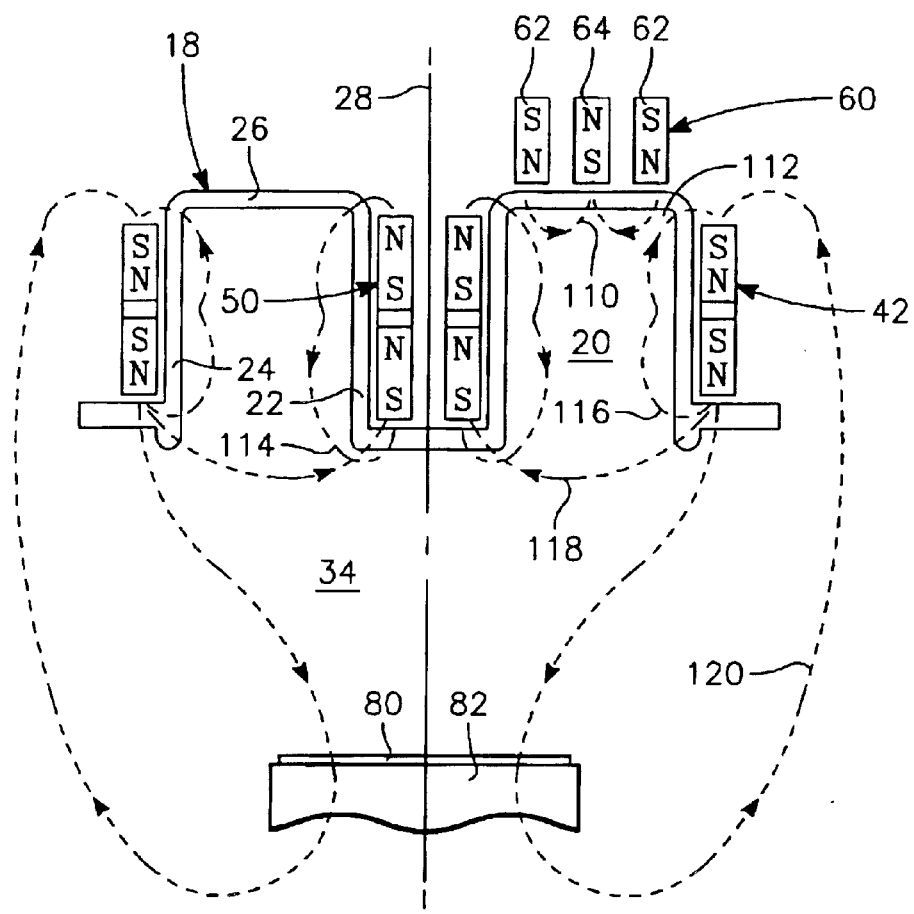
FIG. 2 is a schematic illustration of the magnetic field distribution produced by the magnetrons in the sputter reactor of FIG. 1.

The magnetic field distribution produced by the roof and sidewall magnetrons, as illustrated schematically in the cross-sectional view of FIG. 2, has many complex and interacting parts. The figure is shown approximately to scale for a sputter reactor accommodating a 200 mm wafer 82, having a target 24 with an effective diameter within the chamber of about 380 mm, and a spacing between the target 24 and wafer 82 of about 290 mm. The roof magnetron 60 produces a semi-toroidal magnetic field component 110 lying generally parallel to the inner face of the target roof 26, thereby increasing the plasma density in the area of the roof 26 over which it is then passing. The roof magnetron 60 is unbalanced which has the effect of producing an unillustrated component between the radially outer portion of the outer roof pole 62 and the adjacent portion of the outer sidewall magnetron 42, thereby creating a particularly high magnetic field and plasma density at the outer upper corner 112 of the vault 20 near the passing roof magnetron 60.

The inner sidewall magnetron 50 produces a magnetic field component 114 that is generally parallel to the inner vault sidewall 22, but the non-magnetic spacer 56 produces a kink in the inner sidewall component, thereby decreasing sputtering in the portion of the inner sidewall 22 near the kink. The outer sidewall magnetron 42 produces a similar outer sidewall magnetic field component 116 parallel and close to the outer sidewall 24. However, because the outer sidewall magnetron 42 has a magnetic polarity opposite that of the inner sidewall magnetron 50, the two sidewall components 114, 116 are anti-parallel, and a linking magnetic field component 118 between the two sidewall magnetrons 42, 50 closes the mouth of the vault 20.

Although the sidewall magnetrons 42, 50 generate a relatively high density of plasma throughout the azimuthal portions of the vault sidewalls 22, 24, the roof magnetron 60 is even more effective at generating a very high plasma density in the azimuthal portion of the roof 26 over which it is currently passing, thereby generating in that area a high metal ionization fraction. As a result, the portion of the roof underlying the current position of the roof 26 magnetron magnetron acts as a source of metal ions which are ejected from the vault 20 through its mouth in beam-like fashion.

Because the two sidewall magnetrons 42, 50 are strongly unbalanced with the outer sidewall magnetron 42 being more intense by a factor of 4 and more, the outer sidewall magnetron 42 produces a looping magnetic field component 120 which projects from the bottom of the outer sidewall magnetron 42 towards the wafer 80 but trends towards the central axis 28 before it bends radially outwardly and then back to the top of the outer sidewall magnetron 42. The looping component 120 in this embodiment is substantially symmetric about the central axis 28 and produces several effects. It helps to extract metal ions out the mouth of the vault 20. The looping component 120 guides sputtered metal ions, particularly the high fraction originating from near the roof magnetron 60, towards the wafer 80 with trajectories following the illustrated funnel shape, thereby guiding them towards the wafer 80. The looping component 120 also confines the plasma electrons between the target 18 and the wafer 80 and thus reduces electron loss and intensities the plasma. These effects are for the most part all beneficial for deep hole coating in advanced semiconductor integrated circuits.

Figure 3:
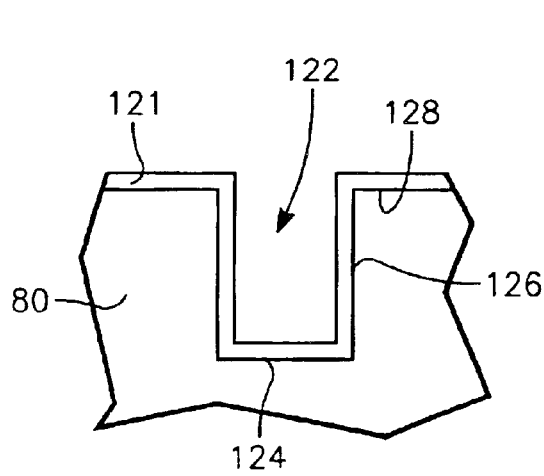
FIG. 3 is a cross-sectional view of a via hole with nearly optimal sidewall and bottom coverage with no overhang.
Figure 4:
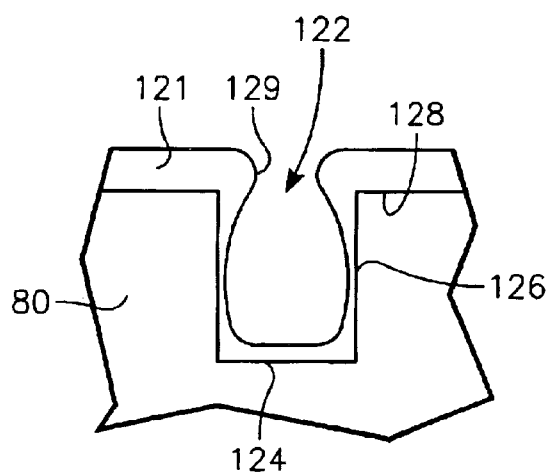
FIG. 4 is a cross-sectional view of a via hole with non-uniform sidewall coverage and a deleterious overhang at the top of the via hole.

The looping component 120 produced by the unbalanced sidewall magnetrons 42, 50 however is subject to some limitations, many of which affect the uniformity of deposition across the wafer 80. The ionization fraction for sputtering metal atoms in present SIP+ reactors can be increased to relatively high values near 50%. However, the neutral fraction of neutral metal atoms remains substantial. The funnel-shaped looping magnetic component 120 tends to focus the metal ions towards the center of the wafer 80 while having no substantial effect on the neutral metal atoms. As a result, near the wafer center, the metal ions dominate deposition of a sputtered metal layer 121 and the negative DC self-bias on the wafer 80 draws the metal ions deeply within a high-aspect ratio hole 122 illustrated in the cross-sectional view of FIG. 3 to produce good coverage at the bottom 124 and sidewall 126 relative to the blanket coverage on a planar top surface 128 at the top of the wafer 80. However, near the wafer periphery, the metal ions are less numerous and the neutral metal atoms dominate so that the sputter particle distribution is more isotropic and the neutral component is not affected by wafer biasing. As a result, as illustrated in the cross-sectional view of FIG. 4, in some applications the bottom coverage may be decreased relative to the blanket coverage, and the sidewall coverage may vary over the depth of the sidewall 126. Further, an overhang 129 may develop near the top corners of the hole 122, which detracts from the sidewall and bottom coverage and may complicate the subsequent metal hole filling by increasing the probability that voids develop in the metallization.

Figure 5:
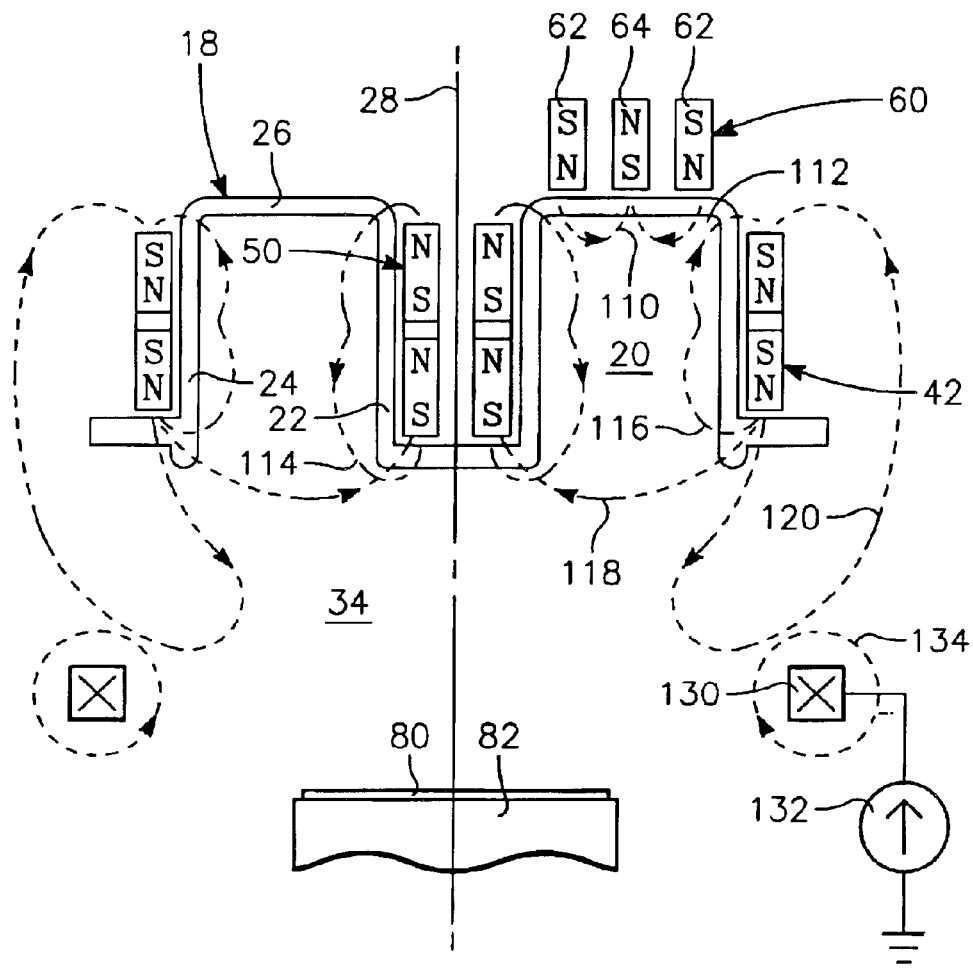
FIG. 5 is a partial cross-sectional view of a sputter reactor including an electromagnet that defocuses the magnetic field optics adjacent the wafer produced by the unbalanced magnetron.

The non-uniform concentration of the metal ions near the wafer center at the expense of the wafer edges can be decreased by defocusing the magnetic optics adjacent the wafer. As illustrated in FIG. 5, an electromagnetic coil 130 is arranged around the central axis 28 in the lower half of the processing space between the target 18 and the wafer 80. The multiple wraps of the electromagnetic coil 130 are conveniently wound around an unillustrated adapter, forming part of the vacuum wall. The adapter has a generally tubular shape except for its end flanges and a few other simple features. Typically, the electromagnetic coil 130 has 600 to 1000 turns wound around an axial length of typically no more than 150 mm and having an impedance of about 7 ohms. The electromagnetic coil 130 is powered by a variable DC power source 132 to produce a toroidal magnetic field 134. The polarity of the DC power source 132 is such that the magnetic field 134 it produces within its throat is opposed to the looping magnetic field component 120 as it propagates towards the wafer 80. The throat of the coil 130 is the generally cylindrical volume around which the coil 130 is wrapped. Stated alternatively, the direction of the electromagnetic component 120 inside the throat of the electromagnet 130 is the same as that of outer sidewall magnetic field component 116 inside the throat of the outer sidewall magnetron 42. In the case of a vaulted target, the throat of the outer sidewall magnetron 42 is the annular volume immediately radially inside it or, in the case of the annularly vaulted target 18, equivalently radially inside the outer target sidewall 24. The electromagnetic coil 130 effectively pushes the looping component from the outer sidewall magnetron 42 away from the wafer 80 and prevents it from focusing the metal ion beam on the center of the wafer. That is, the electromagnetic coil 130 with the indicated polarity defocuses the beam guiding optics of the unbalanced sidewall magnetrons 42, 50 adjacent the wafer producing a more uniform radial distribution of metal ions across the wafer 80. However, with proper selection of the strength of the electromagnetic toroidal field 134, the looping component 120 still focuses the metal ion beam near the target 18 to guide the metal ions out of the vault 20 and through the upper half of the processing space 34. Since an electromagnetic coil 130 is used create the auxiliary magnetic field, the strength of the toroidal field 134 may be selected to a predetermined and variable degree to effect a desired amount of defocusing.

Figure 6:
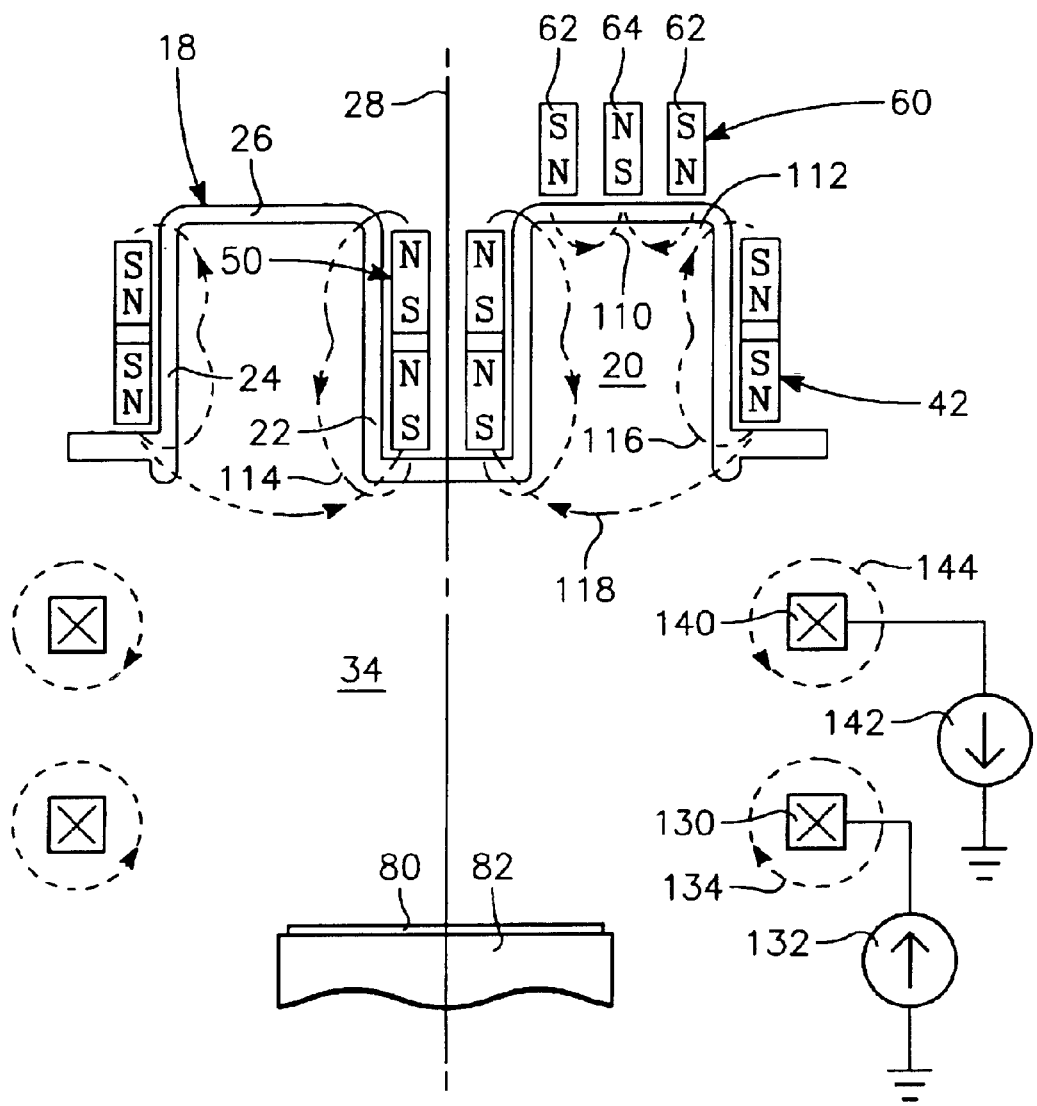
FIG. 6 is a partial cross-sectional view of a sputter reactor including two opposed electromagnets.

Another configuration, illustrated in the cross-sectional view of FIG. 6, includes two coaxial, preferably opposed, electromagnetic coils. The first electromagnetic coil 130 is disposed in the lower half of the processing space 34 between the lower side of the target 18 and the wafer 80 and defocuses the magnetic optics adjacent the wafer 80. A second electromagnetic coil 140 is disposed at least partially in the upper half of the processing space 34 so that its upper side is relatively close to the target 18. It is powered by a second selective DC power source 142 preferably having the opposite electrical polarity from that of the first DC power supply 132. The second electromagnetic coil 140 thereby produces a second toroidal magnetic field 144 of opposite rotational sense than that of the first toroidal magnetic field 134. Since it is adjacent the target 18, it tends to focus the metal ions coming out of the mouth of the target vault 20. It also tends to eliminate the projecting part of the looping magnetic component and to strengthen the outer sidewall component 116 produced by the outer sidewall magnetron 42, thus increasing the plasma density on the outer vault sidewall 24.

The two electromagnetic coils 130, 140 can be wound on a single adapter or more preferably on separate adapters.

The opposed coaxial electromagnets were tested in an SIP+ plasma reactor with a baseline set of operating conditions of 40 kW of DC power applied to the copper target and 225 W of RF power applied to the pedestal electrode in coating a thin layer of copper into a 0.18 μm-wide, 1 μm-deep hole, a challenging aspect ratio of more than 5. When both electromagnets are unpowered, significant overhangs may develop at the top of the hole and threaten to close off the hole. Sidewall coverage may also be non-uniform. When about 1 A of current with the indicated polarities is applied to each coil having the same number of turns, the overhangs are significantly reduced and sidewall uniformity improves. Good effects are obtained with ratios of currents between 90% and 110%. The electromagnets also improve the surface resistivity of the deposited film, which can be equated to the thickness of the blanket layer. It is believed that the improved resistivity uniformity results from the metal ions not being concentrated at the wafer center.

Electromagnets on the chamber sidewall can be used for other effects. With reference to FIG. 2, the strongly unbalanced sidewall magnetrons 42, 50 advantageously produces the looping component 120, which not only projects towards the wafer 80 but also extends far to the sides as it returns to the top of the outer sidewall magnetron 42. This behavior differs substantially from standard magnetrons in which the magnetic field is confined close to the target. The strong and looping magnetic fields however may extend far from the sputter reactor of primary interest. For advanced copper vias, one SIP+ sputter reactor may be used to sputter a Ta or TaN barrier layer and another SIP+ reactor used to sputter a thin Cu seed layer over the Ta/TaN barrier. The two sputter reactors may be positioned adjacent to each other on the sides of a central transfer chamber, which allows wafers to be transferred between chambers for different processing steps without exposing them to oxidizing ambient. However, the relatively strong looping magnetic fields of the two sputter reactors may interfere and produce a non-circularly symmetric magnetic field within the processing spaces 34 of both chambers, including the beneficial looping component 120. As a result, the magnetic guiding varies in unintended ways, and the azimuthal uniformity is degraded. The magnetic fields within the target vaults 20 are stronger and more localized and thus not affected so much.

Figure 7:
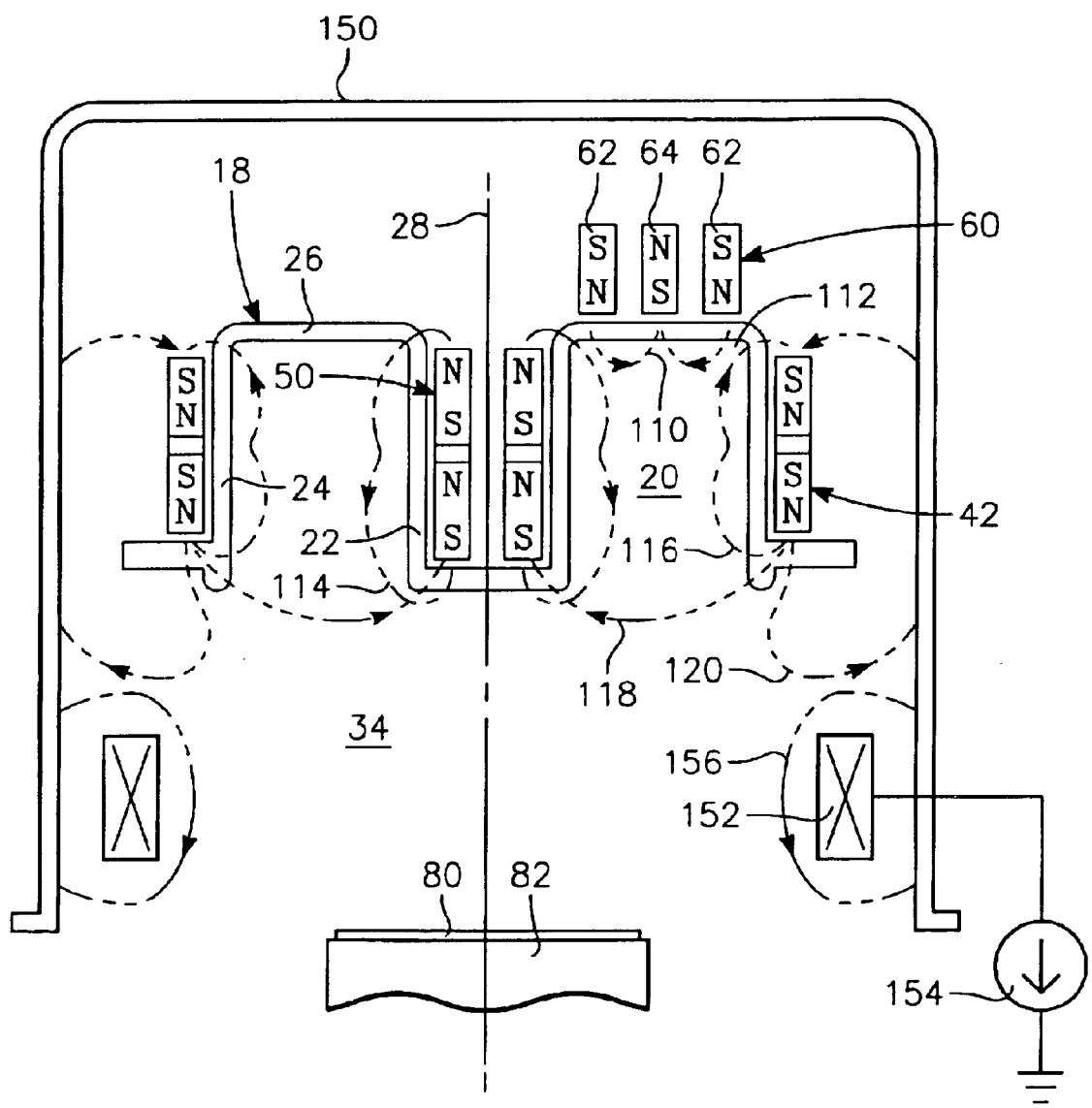
FIG. 7 is a partial cross-sectional view of a sputter reactor with a magnetic shield and a compensating electromagnet.

Such cross interference can be reduced by surrounding one or both reactors with a magnetic shield. Typically, as illustrated in the cross-sectional view of FIG. 7, a magnetic shield 150 formed as a partial shroud extends to the bottom of the adapters and surrounds all but the bottom of the chamber containing the target 18 and pedestal electrode 82. The magnetic shield 150 is formed of a high-mu magnetic material, such as soft stainless steel, e.g., SS306, or a NiFe alloy, which tends to shunt magnetic field. As a result, the magnetic field from adjacent chambers is blocked. However, the magnetic shield 150 also shunts the magnetic field from within the chamber surrounded by the shield 150. As a result, the looping component 120 produced by the outer sidewall magnetron 42 is pulled away from the central axis 28 and the pedestal electrode 82 towards the shield 150 before returning to the top of the outer sidewall magnetron 42. That is, although inter-reactor interference is reduced, the focusing and guiding effects of the unbalanced magnetrons 42, 50 and the looping component 120 are significantly and deleteriously reduced.

In compensation, an electromagnetic coil 152 is positioned around the processing space between the target 18 and the wafer 80. A DC power supply 154 supplies it with current to produce a electromagnetic field component 156 which is generally toroidal but is also shunted by the magnetic shield 150. However, its parts nearer the central axis are not significantly affected by the magnetic shield 150. The polarity of the power supply 154 is such that the electromagnetic field component 156 within the throat of the electromagnet 152 tends to be generally parallel with the looping component 120 in the processing space 34 and anti-parallel to the sidewall component 116 within the throat of the stronger outer sidewall magnetron 42. Note that the current polarity in the described embodiment is opposite that of FIG. 5. The electromagnet coil 152 and its electromagnetic field component 156 thus substitute for the shunted looping component 120 in guiding and focusing the metal ions traversing the space between the target 18 and the wafer 80. Although the figure illustrates the looping component 120 and the electromagnetic component propagating antiparallel on the top of the electromagnet 152, when their magnitudes are properly selected, they tend to cancel out with the effect that the electromagnet 152 pulls the looping component to within the space between its annular extent and the looping component 120 is effectively shunted to the magnetic shield 150 below the bottom of the electromagnet 152.

It is of course appreciated that, if a magnetic shield is used with the magnet configurations of FIGS. 5 and 6, the different coil currents can be adjusted to similarly compensate for the shunting of the desired looping component.

Figure 8:
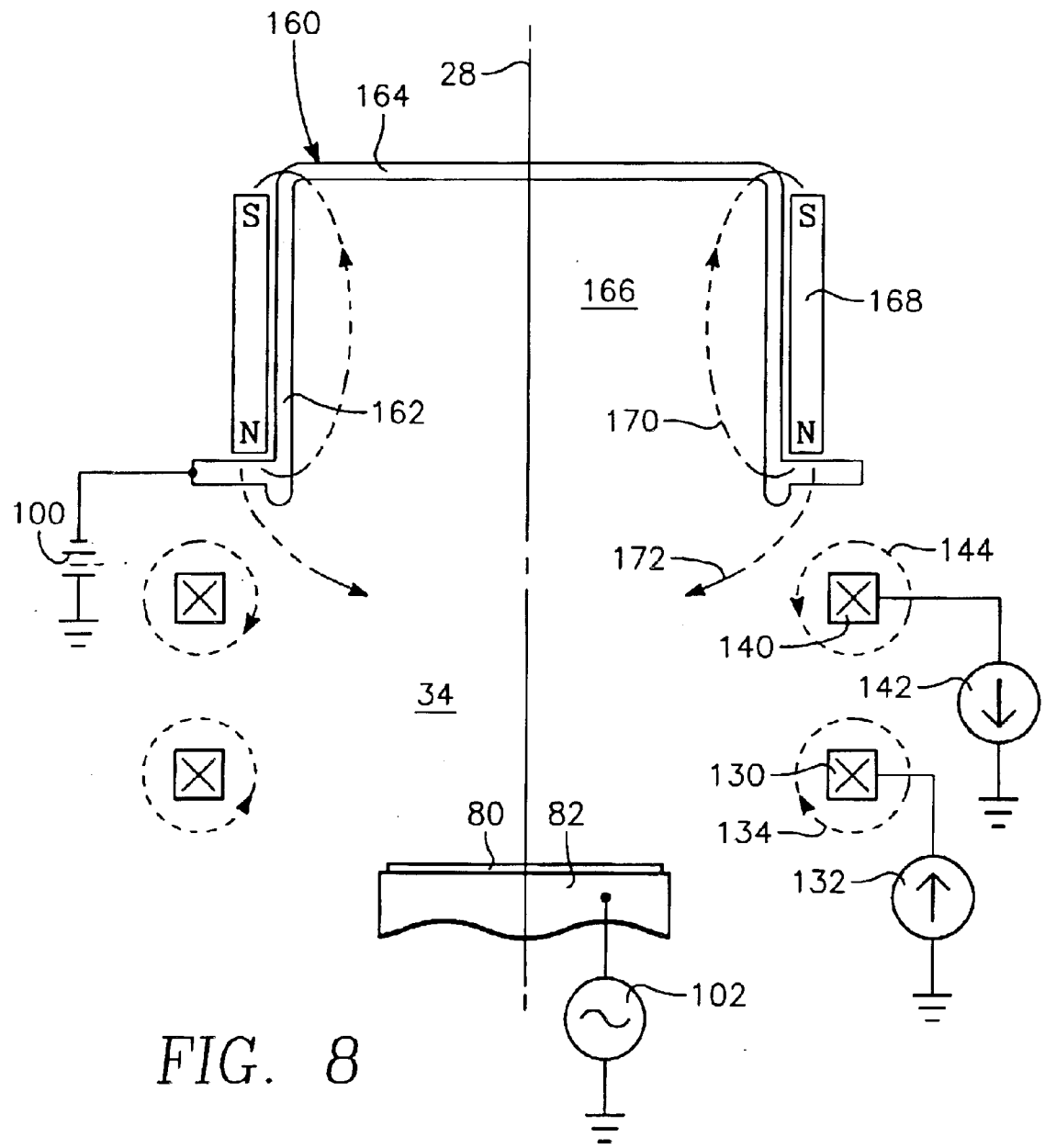
FIG. 8 is a partial cross-sectional view of a hollow cathode magnetron reactor including additional magnetic coils.

Various of the aspects of the invention can be extended to a hollow cathode sputter reactor. Such a reactor, as partially illustrated in the cross-sectional view of FIG. 8, includes a complexly shaped target 160 having a tubular sidewall 162 and a disk-shaped upper wall 164, which may be more dome-shaped if no roof magnets are used. The sidewall 162 and upper wall 164 are arranged about the central axis 28 and form a generally right cylindrical vault 166 facing the wafer 80. A tubular magnet assembly 168 surrounds the target sidewall 162 and creates a sidewall magnetic field component 170 and a looping component 172 which trends from the bottom of the magnet assembly 168 towards the central axis 28 before looping back behind the magnet assembly 168 to its top.

Although the magnetic confinement associated with this type of hollow-cathode magnetron is not usually described as unbalanced and is accomplished by a significantly different configuration of magnets, it nonetheless produces some of the same effects as the unbalanced sidewall magnetrons 42, 50 associated with the previously described annularly vaulted target 18. Accordingly, the additional coils associated with the embodiments of FIGS. 6 and 7 can advantageously be applied to the hollow-cathode magnetron of FIG. 8. For example, the illustrated opposed coils 130, 140 can both aid the magnetic confinement in the vault 166 of the target while defocusing the resultant ion beam in the neighborhood of the wafer 80.

The auxiliary electromagnets included in various embodiments of the invention provide additional control over the important magnetic field components extending between the target and the wafer. The coils are easily wound on and supported by the chamber wall, especially when an adapter is used. The coil's electrical power supply, which may be relatively modest for a multi-turn coil, allows easy tuning and adjustment.

What is claimed is:

1. A magnetron sputter reactor arranged about a central axis, comprising:
   a pedestal for supporting a substrate disposed around said central axis;
   a sputtering target having an annular vault facing said pedestal across a processing space and having a generally cylindrical outer and inner sidewalls generally symmetric about and parallel to said central axis;
   a first magnet assembly positioned in back of said outer sidewall from said vault, having a first magnetic polarity along said central axis, and producing a first magnetic field component along said central axis within a throat of the first magnet assembly;
   a second magnet assembly position in back of said inner sidewall from said vault, having a second magnetic polarity opposite said first magnetic polarity; and
   an electromagnetic coil arranged about said processing space, wrapped around said central axis, and energized to produce a second magnetic field component along said central axis within a throat of said electromagnetic coil that is parallel to said first magnetic field component.

2. The reactor of claim 1, wherein a total magnetic intensity of said first magnet assembly is at least four times greater than that of said second magnet assembly.

3. The reactor of claim 2, wherein said target includes a roof generally perpendicular to said central axis and bridging said inner and outer sidewalls on a side of said annular vault and further comprising a magnetron disposed in back of said roof from said vault.

4. The reactor of claim 3, wherein said magnetron includes an outer pole of one magnetic polarity and an inner pole of magnetic polarity opposite said one magnetic polarity, surrounded by said outer pole and wherein said magnetron is rotatable about said central axis.

5. A magnetron sputter reactor arranged about a central axis, comprising:
   a pedestal for supporting a substrate disposed around said central axis;
   a sputtering target having a vault facing said pedestal across a processing space and having a generally cylindrical first sidewall generally symmetric about and parallel to said central axis;
   a first magnet assembly positioned in back of said first sidewall from said vault, having a first magnetic polarity along said central axis, and producing a first magnetic field component along said central axis within a throat of said first magnet assembly;
   a first electromagnetic coil arranged about said processing space and wrapped around said central axis; and
   a second electromagnetic coil arranged about said processing space, wrapped around said central axis, and disposed closer to said pedestal than said second magnetic coil.

6. The reactor of claim 5, further comprising:
   a first electrical power supply powering said first electromagnetic coil; and
   a second electrical power supply powering said second electromagnetic coil independently from said first electrical power supply.

7. The reactor of claim 5,
   wherein said first electromagnetic coil is energized to produce a magnetic field component along said central axis within a throat of said first electromagnetic coil that is anti-parallel to said first magnetic field component, and
   wherein said second electromagnetic coil is energized to produce a magnetic field component along said central axis within a throat of said second electromagnetic coil that is parallel to said first magnetic field component.

8. The reactor of claim 5, wherein said vault is a generally right cylindrical vault.

9. The reactor of claim 8, further comprising:

a first electrical power supply powering said first electromagnetic coil; and a second electrical power supply powering said second electromagnetic coil independently from said first electrical power supply.

10. The reactor of claim 8, wherein said first electromagnetic coil is energized to produce a magnetic field component along said central axis within a throat of said first electromagnetic coil that is anti-parallel to said first magnetic field component, and wherein said second electromagnetic coil is energized to produce a magnetic field component along said central axis within a throat of said second electromagnetic coil that is parallel to said first magnetic field component.

11. The reactor of claim 5, wherein said target has a generally cylindrical second sidewall generally symmetric about and parallel to said central axis and arranged radially inwardly of said first sidewall, whereby said vault is annularly shaped about said central axis.

12. The reactor of claim 11, further comprising a second magnet assembly positioned in back of said second sidewall from said vault and having a second magnetic polarity opposite said first magnetic polarity.

13. The reactor of claim 12, wherein a total magnetic intensity of said first magnet assembly is at least four times greater than that of said second magnet assembly.

14. The reactor of claim 13, further comprising:

a first electrical power supply powering said first electromagnetic coil; and a second electrical power supply powering said second electromagnetic coil independently from said first electrical power supply.

15. The reactor of claim 13, wherein said first electromagnetic coil is energized to produce a magnetic field component along said central axis within a throat of said first electromagnetic coil that is anti-parallel to said first magnetic field component, and wherein said second electromagnetic coil is energized to produce a magnetic field component along said central axis within a throat of said second electromagnetic coil that is parallel to said first magnetic field component.

16. A magnetron sputter reactor arranged about a central axis, comprising:

a pedestal for supporting a substrate disposed around said central axis;

a sputtering target having a vault facing said pedestal across a processing space and having a generally cylindrical first sidewall generally symmetric about and parallel to said central axis;

a first magnet assembly positioned in back of said first sidewall from said vault, having a first magnetic polarity along said central axis, and producing a first magnetic field component along said central axis within a throat of said first magnet assembly;

a magnetic shield positioned around said target and said processing space; and a first electromagnetic coil arranged about said processing space, wrapped around said central axis, and energized to have a magnetic field component in a throat of said first electromagnetic coil that is anti-parallel to said first magnetic field component.

17. The reactor of claim 16, wherein said vault is generally right cylindrically shaped about said central axis.

18. The reactor of claim 16, wherein said target has a generally cylindrical second sidewall generally symmetric about and parallel to said central axis and arranged radially inwardly of said first sidewall, whereby said vault is annularly shaped about said central axis.

19. The reactor of claim 18, further comprising a second magnet assembly positioned in back of said second sidewall from said vault and having a second magnetic polarity opposite said first magnetic polarity.

20. The reactor of claim 19, wherein a total magnetic intensity of said first magnet assembly is at least four times greater than that of said second magnet assembly.

* * * * *